United States Patent [19]
Tabei

[11] Patent Number: 5,283,633
[45] Date of Patent: Feb. 1, 1994

[54] SOLID STATE IMAGE PICKUP DEVICE IN WHICH PICTURE ELEMENTS OF GREEN ARE GENERATED IN VERTICAL CHARGE TRANSFER PATHS

[75] Inventor: Masatoshi Tabei, Kanagawa, Japan

[73] Assignee: Fuji Photo Film Co., Ltd., Kanagawa, Japan

[21] Appl. No.: 610,641

[22] Filed: Nov. 8, 1990

[30] Foreign Application Priority Data

Nov. 10, 1989 [JP] Japan .................................. 1-291309

[51] Int. Cl.$^5$ .............................................. H04N 9/07
[52] U.S. Cl. .................................... 348/281; 348/282
[58] Field of Search ....................... 358/41, 44, 213.12, 358/213.28, 213.29; H04N 3/14, 9/04, 9/07

[56] References Cited

U.S. PATENT DOCUMENTS

| | | | |
|---|---|---|---|
| 4,734,759 | 3/1988 | Kobori et al. | 358/44 |
| 4,814,865 | 3/1989 | Tabei et al. | 358/44 |
| 5,025,319 | 6/1991 | Mutoh et al. | 358/213.29 |

Primary Examiner—Edward L. Coles, Sr.
Assistant Examiner—Kim Yen Vu
Attorney, Agent, or Firm—Sughrue, Mion, Zinn, Macpeak & Seas

[57] ABSTRACT

A solid-state image pickup device in which a plurality of optoelectric transducing elements are vertically and horizontally arranged into a matrix array, groups of optoelectric transducing elements arrayed in first rows serve as picture elements having a red spectral characteristic, groups of optoelectric transducing elements arrayed in second rows serve as picture elements having a blue spectral characteristic, and vertical charge transfer paths and groups of picture elements arrayed in the column direction are alternately arranged. In accordance with the invention, segmental portions of each of the vertical charge transfer paths, which positionally correspond to respective ones of the picture elements, include portions where charge transfer electrodes are layered and portions where no transfer electrodes are layered, an impurity is distributed in predetermined portions of the vertical charge transfer path under the charge transfer electrodes and the portions with no charge transfer electrodes in the charge transfer direction, thereby to set up potential levels of different depths, potential wells, that are caused by applying a signal of a predetermined voltage to the charge transfer electrodes when an image is being sensed, are used as picture elements of green, and signal charge is transferred by applying a drive signal recurring at predetermined periods to the charge transfer electrodes.

6 Claims, 4 Drawing Sheets

FIG. 3
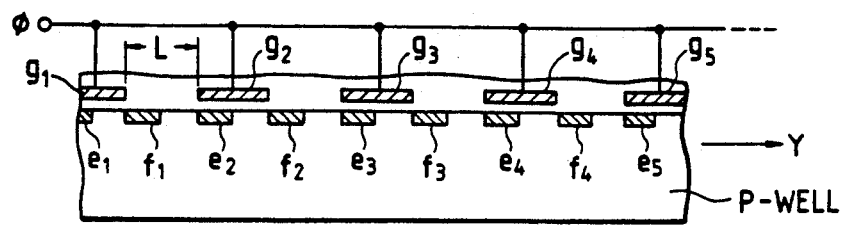
FIG. 4(a) $t_1$
FIG. 4(b) $t_2$
FIG. 4(c) $t_3$
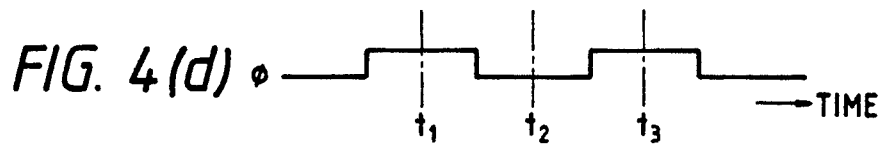
FIG. 4(d) φ

SOLID STATE IMAGE PICKUP DEVICE IN WHICH PICTURE ELEMENTS OF GREEN ARE GENERATED IN VERTICAL CHARGE TRANSFER PATHS

BACKGROUND OF THE INVENTION

The present invention relates to a solid-state image pickup device constructed with charged coupled devices (CCDs) of the interline transfer type, and more particularly to a solid-state image pickup device improved in that the number of picture elements is increased and its vignetting factor is increased by applying the vertical charge transfer paths within a light-receiving area to photosensitive portions (picture elements).

A conventional solid-state image pickup device will be described with reference to FIG. 6. In FIG. 6, reference numeral 1 designates a light-receiving area; 2, a horizontal charge transfer path; and 3, an output amplifier. Photodiodes are vertically and horizontally arranged into an n×m matrix array within the light-receiving area 1. Color filters of green (G) are layered on the light incident surfaces of the photodiodes linearly arrayed in even-numbered rows, thereby to form pixels with green spectral sensitivity $a_{2,1}, a_{2,2}, \ldots, a_{2,m}, a_{4,1}, a_{4,2}, \ldots, a_{4,m}, a_{n,1}, a_{n,2}, \ldots, a_{n,m}$.

Vertical charge transfer paths $l_1, l_2, \ldots, l_m$ and groups of blue and green pixels linearly arrayed in columns are alternately arranged. Transfer electrodes (not shown) made of polysilicon, which are used for transferring signal charge in the vertical direction in response to drive signals based on the so-called four-phase drive system, are layered on respective ones of the vertical charge transfer paths.

The terminals of the vertical charge transfer paths $l_1, l_2, \ldots, l_m$ are coupled with the horizontal charge transfer path 2, while being disposed side by side. The output amplifier 3 is provided at the output terminal of the horizontal charge transfer path 2.

A structure of the light-receiving area 1 will be described in detail with reference to FIG. 7.

The structure in the vicinity of the blue pixels $a_{1,1}, a_{1,2},$ and $a_{1,3}$ and the green pixels $a_{2,1}, a_{2,2},$ and $a_{2,3}$ will be described as a typical example for ease of explanation. In the figure, the blue and green pixels are separated from the vertical charge transfer paths $l_1, l_2,$ and $l_3$ by channel stoppers as shaded. Pairs of transfer electrodes $G_1$ and $G_2$, and $G_3$ and $G_4$, each pair being allocated for each linear array of the pixels in the row, are layered on the upper surfaces of the vertical charge transfer paths $l_1, l_2,$ and $l_3$ (except the upper surfaces of the blue and green pixels). In operation, drive signals $\phi_1, \phi_2, \phi_3,$ and $\phi_4$ based on the four-phase drive system are applied to the transfer electrodes. In response to the drive signals, potential wells (referred to as transfer elements) for transferring signal charge are generated in the vertical charge transfer paths $l_1, l_2,$ and $l_3$.

A transfer gate $Tg_1$ is inserted between one end of each blue pixel and a transfer element adjacent to the pixel. A transfer gate $Tg_2$ is inserted between one end of each green pixel and a transfer element adjacent to the pixel. When high voltage signals are applied to the related transfer gates $G_2$ and $G_4$, the transfer gates $Tg_1$ and $Tg_2$ are rendered conductive.

A sectional structure of the vertical charge transfer paths as taken on line X—X in FIG. 7 will be described with reference to FIG. 8. The transfer electrodes $G_1, G_2, G_3, G_4, \ldots$, which are made of polycrystal, are formed on a silicon oxide film ($SiO_2$) to serve as a gate oxide film layer, which is formed on the surface of a P-well layer in a semiconductor substrate. In this instance, when an "H" (high) drive signal is applied to the transfer electrodes $G_1$ and $G_2$, and an "L" (low) level drive signal is applied to the transfer electrodes $G_3$ and $G_4$, a deep potential well is formed under the electrodes $G_1$ and $G_2$, and a shallow potential barrier is formed under the transfer electrodes $G_3$ and $G_4$. Signal charge can be stored in the well. The potential wells of the transfer elements (as indicated by shading in FIG. 6) are deepened when an image is picked up, and are used as red pixels. For example, in FIG. 7, color filters of red (R) are formed on the upper surfaces of the transfer electrodes $G_1, G_3,$ and $G_3$. When an image is to be sensed, the drive signals $\phi_1$ to $\phi_3$ applied to those electrodes are set to the "H" level, and the drive signal $\phi_4$ applied to the transfer electrode $G_4$ is set to the "L" level. The transfer elements by the electrodes $G_1$ to $G_3$ are used as red pixels. Those pixels are separated by the potential barrier under the transfer electrode $G_4$. The pixels of the same color can be formed by applying the drive signals $\phi_1$ to $\phi_4$ to the remaining transfer electrodes in the same phase relation.

An image pickup operation of the solid-state image pickup device thus arranged will be described.

During an exposure period, the related drive signals (e.g., $\phi_2$ to $\phi_4$) are set to the "H" level, and the remaining drive signal (e.g., $\phi$) is set to the "L" level. With such level settings, groups of red pixels are generated in the vertical charge transfer paths. The red pixels thus generated, and the blue and green pixels as constructed with the photodiodes, accumulate signal charge. After the exposure is completed, the red signal charge is transferred toward the horizontal charge transfer path 2 using the four-phase drive system.

In synchronism with the transfer operation, all of the red pixel signals are read out of the horizontal charge transfer path 2. Then, the drive signals whose voltage is higher than a normal voltage are applied to the related transfer electrodes. With voltage is applied, the transfer gates $Tg_1$ associated with the blue pixels are made conductive and the signal charges of the blue pixels are transferred to the vertical charge transfer path. The transfer gates $Tg_1$ are then made nonconductive again. Following this, the blue signal charge is transferred toward the horizontal charge transfer path 2 by the four-phase drive system. In synchronism with the transfer operation, all of the blue pixel signals are read out on the horizontal charge transfer path 2. Next, the drive signals whose voltage is higher than a normal voltage are applied to the related transfer electrodes. With application of the high voltage, the transfer gates $Tg_2$ associated with the green pixels are made conductive, and the signal charges of the green pixels are transferred to the vertical charge transfer path. The transfer gates $Tg_2$ are then again rendered nonconductive. Following this, the green signal charge is transferred toward the horizontal charge transfer path 2 by the four-phase drive system. In synchronism with the transfer operation, all of the green pixel signals are read out on the horizontal charge transfer path 2.

In this way, the pixel signals are read out every color in an area-sequential scan manner. The pixel signals of these colors thus obtained are equal to one another in number ($(n/2) \times m$) and resolution, as seen from FIG. 6.

When an image is reproduced by forming luminance signal and color signals from the pixel signals in such image pickup operation, the perceived resolution of the reproduced image becomes better as the high frequency content of the luminance signal is increased. In this respect, there is a strong demand for developing solid-state image pickup devices of high spatial sampling frequencies for the color pixels.

SUMMARY OF THE INVENTION

Accordingly, an object of the present invention is provide a solid-state image pickup device in which the spatial sampling frequency of the green pixels can be increased, which are key picture elements in forming the luminance signal.

To achieve the above and other objects, there is provided a solid-state image pickup device in which a plurality of optoelectric transducing elements are vertically and horizontally arranged into a matrix array, groups of optoelectric transducing elements arrayed in first rows (e.g., odd-numbered rows) serve as picture elements having a red (R) spectral characteristic, groups of optoelectric transducing elements arrayed in second rows (e.g., even-numbered rows) serve as picture elements having a blue (B) spectral characteristic, and vertical charge transfer paths and groups of picture elements arrayed in the column direction (vertical direction) are alternately arranged, improved in that the segmental portions of each vertical charge transfer path, which positionally correspond to respective ones of the picture elements, include portions where charge transfer electrodes are layered and portions where no transfer electrodes are layered, an impurity is distributed in the portions of the vertical charge transfer path under the charge transfer electrodes and the portions with no charge transfer electrodes in the charge transfer direction, thereby to set up potential levels of different depths, potential wells, that are caused by applying a signal of a predetermined voltage to the charge transfer electrodes when an image is being sensed, are used as the picture elements of green (G), and signal charge is transferred by applying a drive signal recurring at predetermined periods to the charge transfer electrodes.

In the solid-state image pickup device thus arranged, the pixels of green can be formed in the vertical charge transfer path at a spatial sampling frequency that is twice as high as that of the pixels of blue and red. Accordingly, the luminance signal thereby formed has a higher frequency band than produced by the conventional solid-state image pickup device. By using the luminance signal, the image pickup device can reproduce an image of excellent resolution feeling.

BRIEF DESCRIPTION OF THE DRAWINGS

FIG. 3 is a sectional view showing the structure of a vertical charge transfer path;

FIGS. 4(a)–4(d) are timing charts used in explaining the operation of the vertical charge transfer path in a preferred embodiment of the invention;

DESCRIPTION OF THE PREFERRED EMBODIMENTS

Preferred embodiments of a solid-state image pickup device constructed according to the teachings of the present invention will be described with reference to the accompanying drawings.

Figure 1:
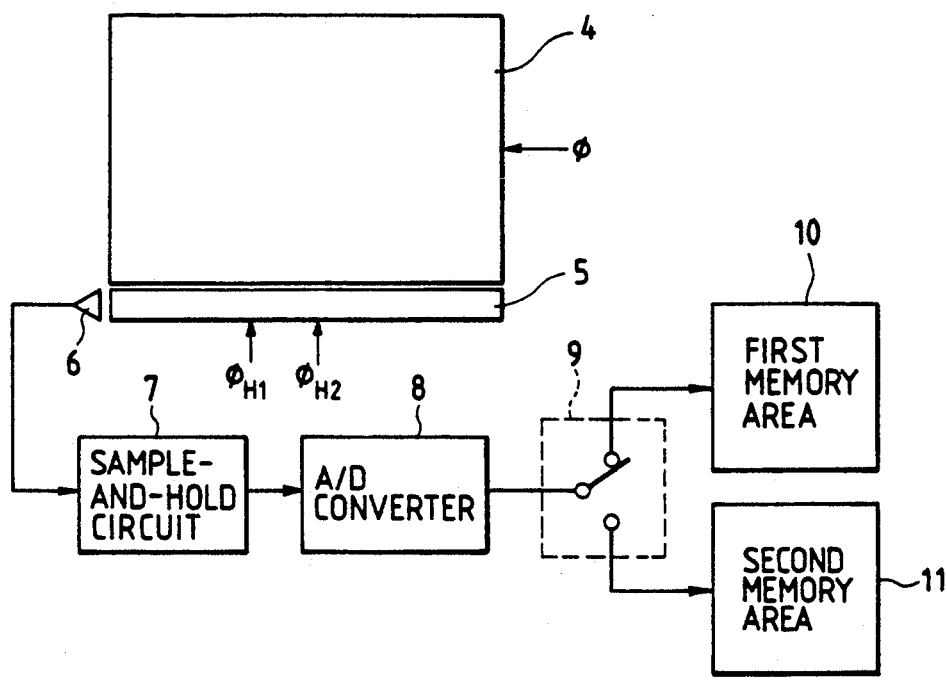
FIG. 1 is a block diagram showing the overall arrangement of a solid-state image pickup device of the invention.

The overall arrangement of a solid-state image pickup device will be explained with reference to FIG. 1. In the figure, reference numeral 4 designates a light-receiving area. In this area, a plurality of photodiodes, one for each pixel, are arranged vertically and horizontally into a matrix array. Vertical charge transfer paths are disposed adjacent the linear arrays of photodiodes, which extend in the column direction. The terminals of the vertical charge transfer paths are coupled with a horizontal charge transfer path 5, while being disposed side by side. An output amplifier 6 is disposed at the output terminal of the horizontal charge transfer path.

Reference numeral 7 designates a sample-and-hold circuit for sampling pixel signals as read through the output amplifier 6 at preset timings. Reference numeral 8 designates an A/D (analog-to-digital) converter for converting a pixel signal as sampled by the sample-and-hold circuit 7 and into a digital signal. A channel selector 9 selectively forms a path from the output of the A/D converter 8 to a first memory area 10 and a second memory area 11.

Figure 2:
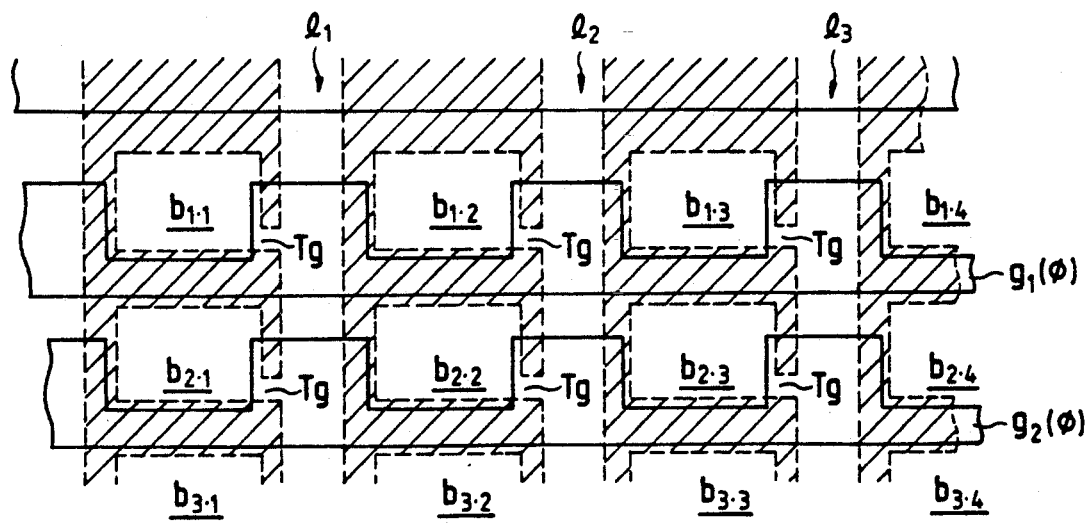
FIG. 2 is an enlarged plan view showing a key portion of a light-receiving area in the structure shown in FIG. 1.

The structure of the light-receiving region will be described in detail with reference to FIG. 2. In the figure, a group of pixels of blue (B) denoted as $b_{1,1}$, $b_{1,2}$, $b_{1,3}$, ... is linearly arrayed in one of the odd-numbered rows. A group of pixels of red (R) denoted as $b_{2,1}$, $b_{2,2}$, $b_{2,3}$, ... is linearly arrayed in one of the even-numbered rows. Groups of pixels likewise are linearly arrayed in the columns or the vertical direction, respectively. Vertical charge transfer paths $l_1$, $l_2$, $l_3$, ... and those column or vertical linear arrays of pixels are alternately arranged, as shown.

More specifically, photodiodes are arranged into a diode matrix of size $n \times m$ (e.g., $n=500$ and $m=400$). Color filters of blue are applied over the light-receiving surfaces of the linear arrays of photodiodes in the odd-numbered rows. The photodiodes of the linear array that are covered with the blue filter serve as the pixels $b_{1,1}$, $b_{1,2}$, $b_{1,3}$, ... with a blue spectral characteristic. Color filters of red are applied over the light-receiving surfaces of the linear arrays of photodiodes in the even-numbered rows. The photodiodes of the linear array that are covered with the red filter serve as the pixels $b_{2,1}$, $b_{2,2}$, $b_{2,3}$, ... with a red spectral characteristic.

Segmental portions of each vertical charge transfer path, which positionally correspond to respective ones of the pixels, include portions where charge transfer electrodes $g_1$, $g_2$, ... are layered and portions where no transfer electrodes are layered. A transfer drive signal $\phi$ is applied to each charge transfer electrode. A transfer gate Tg is formed between each pixel and the vertical charge transfer path adjacent to it. The transfer gate Tg becomes conductive when the transfer drive signal $\phi$ of a preset high voltage is applied to the charge transfer electrode.

The sectional structure of the vertical charge transfer path will be described with reference to FIG. 3. As shown in that figure, the charge transfer electrodes $g_1$, $g_2$, ... are separated from one another by a distance L. Impurity regions of high impurity concentration $e_1$, $e_2$, ... and impurity regions of low impurity concentration are, respectively, formed in those portions of the charge transfer path under the charge transfer electrodes $g_1$, $g_2$, ..., while extending in the charge transfer direction Y. Impurity regions of high impurity concentration $f_1$, $f_2$, ..., and impurity regions of low impurity concentration are, respectively, formed also in the portions of the charge transfer path under the portions where no charge transfer electrodes $g_1$, $g_2$, ... are layered, extending in the charge transfer direction Y.

Where a drive signal $\phi$ of preset periods as shown in FIG. 4(d) is applied to the transfer electrodes, when the drive signal $\phi$ goes the "H" level, for instance, at time point $t_1$, the potential wells under the transfer electrodes are stepwise deepened as shown in FIG. 4(a). The potential wells under the portions without the transfer electrodes remain unchanged and serve as potential barriers. Under this condition, signal charge is retained in the potential wells.

When the drive signal $\phi$ goes to the "L" level, for instance, at time point $t_2$, the potential wells under the transfer electrodes becomes shallow, as shown in FIG. 4(b). The potential wells under the portions without the transfer electrodes becomes deep, and the potential profile is steplike and remains fixed. Under this condition, signal charge is retained in the deepest portion of each potential well under the portions without the transfer electrodes.

When the drive signal $\phi$ goes high again, for example, at time point $t_3$, the potential wells under the transfer electrodes are stepwise deepened as shown in FIG. 4(c). The potential wells under the portions without the transfer electrodes remain unchanged and serve as potential barriers. Under this condition, signal charge is retained in the potential wells.

In this way, the drive signal progressively changes its logical level alternately between "H" and "L" levels. The signal charge is transferred in the direction Y of the horizontal charge transfer path 5 without being mixed.

When an image is being sensed, the drive signal $\phi$ applied to the charge transfer electrodes is kept at the "H" level, and the potential of each well is profiled as shown in FIG. 4(a). The deepest portion in each potential well is used as the pixel of green (G). Accordingly, each green pixel is generated corresponding to the pixels of blue and red. This indicates that the spatial sampling frequency of the green pixel is twice as high as that of the blue and red pixels.

The signal charge as transferred line by line from the vertical charge transfer paths $l_1$, $l_2$, ... in synchronism with the period of the drive signal $\phi$ reach the horizontal charge transfer path 5. The horizontal charge transfer path is controlled so as to transfer the signal charge to the output amplifier 6 in accordance with a two-phase drive system, for example, every time the horizontal charge transfer path receives a signal charge.

Figure 5:
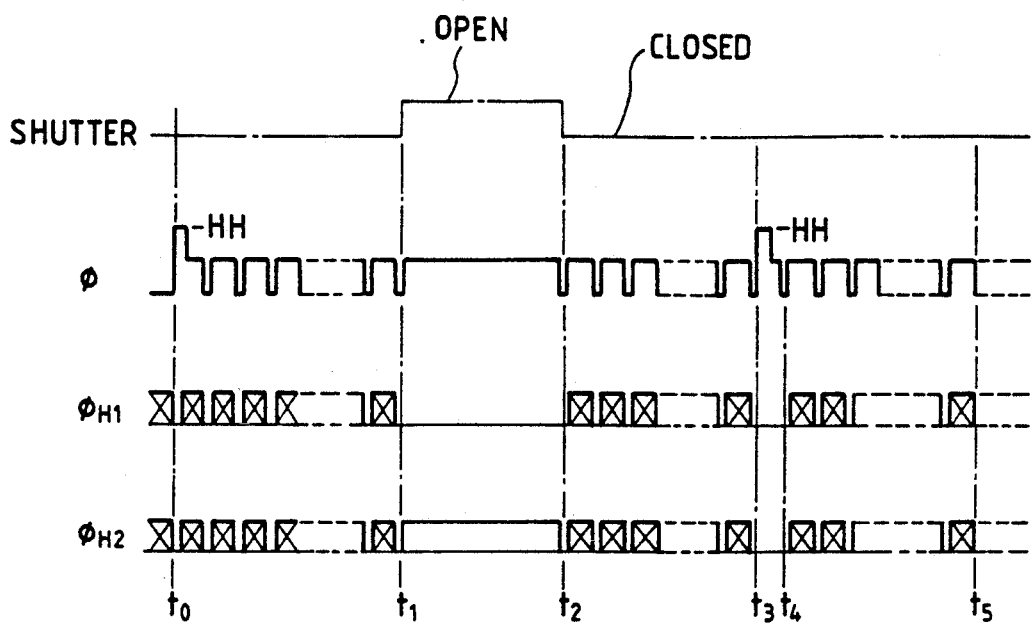
FIG. 5 is a timing chart used in explaining the image pickup device of the invention, which has an electronic shutter function.
Figure 6:
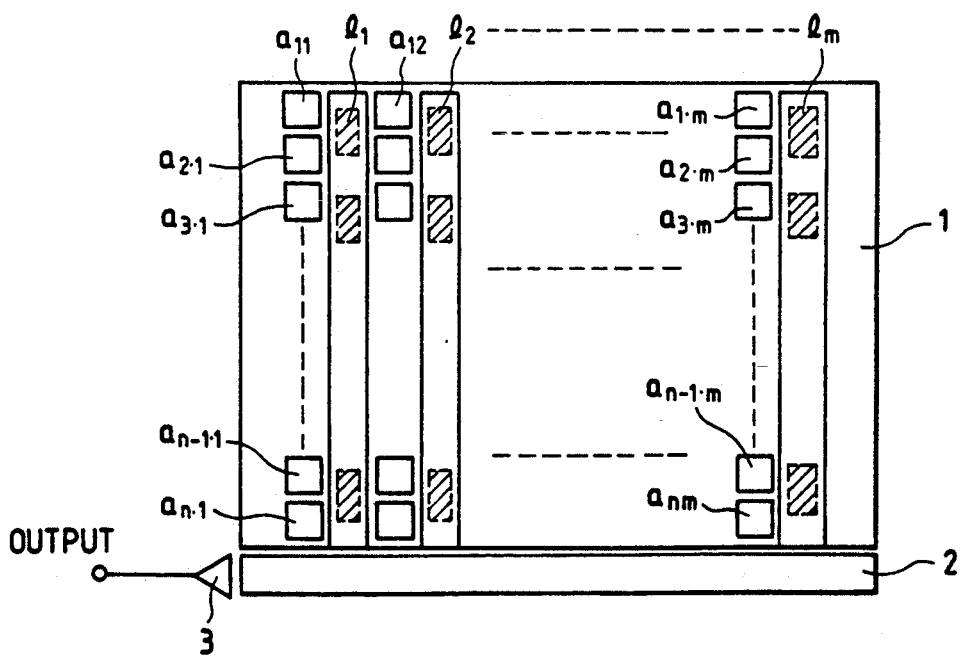
FIG. 6 is a plan view showing the structural arrangement of a conventional solid-state image pickup device.
Figure 7:
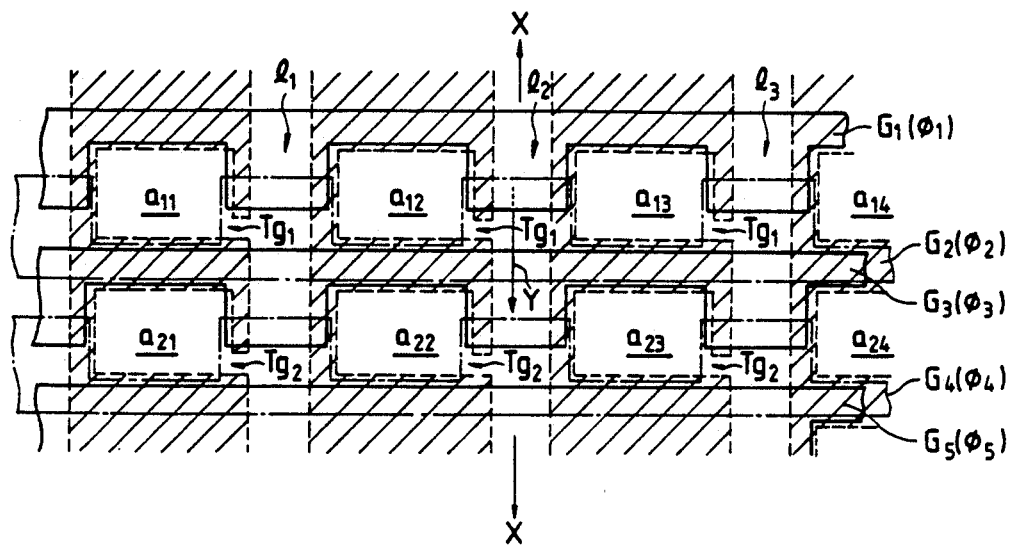
FIG. 7 is an enlarged plan view showing a key portion of a light-receiving area in the structure shown in FIG. 6.
Figure 8:
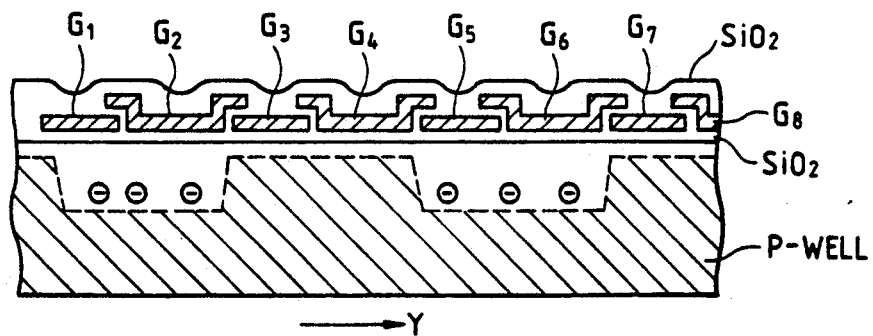
FIG. 8 is a sectional view showing of a part of the vertical charge transfer path shown in FIG. 7.

The operation of the solid-state image pickup device thus arranged will be described with reference to FIG. 5 showing a timing chart. The timing chart shown in FIG. 5 shows the operation of the image pickup device when it is applied to an electronic still camera.

At the point $t_0$, a shutter release button is pushed. In response to this, the drive signal $\phi$ is pulsed to a high voltage signal at the "HH" level. Then, all of the transfer gates Tg are rendered conductive, and through the transfer gates unnecessary charge left in all of the blue and red pixels is transferred to the vertical charge transfer paths. In synchronism with the drive signal $\phi$ at preset periods, the vertical charge transfer paths transfer the signal charge. Further, the horizontal charge transfer paths completely discharge unnecessary charge to the outside in synchronism with drive signals $\phi_1$ and $\phi_2$ of the two-phase drive system.

A mechanical shutter (not shown) provided on the front side of the light-receiving area is opened and exposed to light for a period of time (between time points $t_1$ and $t_2$) corresponding to and determined by the shutter speed. During this period between time points $t_1$ and $t_2$, the drive signal $\phi$ is kept at the "H" level, so that the deep potential wells generated under the charge transfer electrodes are treated as the red pixels and exposed to light (FIG. 4(a)).

Next, after the mechanical shutter is closed, the green pixel signals are transferred line by line to the horizontal charge transfer path 5 in accordance with the drive signal $\phi$, progressively changing its logic level alternately between "H" and "L" levels at preset periods. Before the signal charge of one line reaches the horizontal charge transfer path 5, the path 5 horizontally transfers the signal charge in synchronism with the two-phase drive signals $\phi_1$ and $\phi_2$, and outputs the same through the output amplifier 6. In other words, the signal charge is read out from the pixels through the output amplifier 6. During the period from time point $t_2$ to time point $t_3$, in order to read out the green pixel signals, the channel selector 9 is switched to the first memory area 10. Under this condition, the sample-and-hold circuit 7 and the A/D converter 8 sample the pixel signals and convert them into digital signals, which are subsequently stored in the memory area 10.

After the pixels signals of blue have been read, a drive signal $\phi$ of a predetermined high voltage "HH" is applied to the transfer gates, rendering the transfer gates Tg conductive. Under this condition, the pixel signals of blue and red are transferred to the deepest potential wells under the transfer electrodes. The potential profile in the vertical charge transfer paths resembles that shown in FIG. 4(a). Accordingly, the blue and red pixel signals are alternately transferred to the deep potential wells.

During the next period from $t_4$ to $t_5$, the signal charge is transferred under control similar to that during the period from $t_2$ to $t_3$. During the present period, the channel selector 9 is switched to the second memory area 11. Accordingly, the blue and red pixel signals are stored in the second memory area 11.

As the result of the pixel signal reading operation, the green signals, which correspond to the group of green pixels of size n×m (e.g., 500×400) are stored in the first memory region 10. The blue signals, which correspond to the group of blue pixels of size n/2×m (e.g., 250×400), and the red signals, which correspond to the group of red pixels of size n/2×m (e.g., 250×400), are stored in the first memory region 10. In this way, the number of the green pixel signals is twice as large as that of the red or blue pixel signals.

The pixel signals are read out of the first and second memory regions 10 and 11 in the order of arrayed image pixels, and are reproduced on a monitor, for example.

Thus, in accordance with the present invention, during the exposure, the green pixels are generated in the vertical charge transfer paths between the blue and red pixels. Accordingly, the number of the green pixel signals may be set to be twice as large as that of the red or blue pixel signals. The perceived resolution to the viewer of the resultant reproduced image is markedly improved.

For the incident light that is partially peaked in intensity, an excessive amount of charge is generated, and must be removed. At least two measures to remove the excessive charge have been known. In the first measure, vertical overflow drains are formed in the direction of the substrate depth. In the second measure, by applying an oscillating pulse to the polysilicon electrodes, the excessive charge is made to disappear during the course of the recombination process. Either of those measures can be incorporated into the image pickup device of the present invention, as in the CCD of the interline type.

As may be understood from the foregoing description, in the solid-state image pickup device thus arranged, the pixels of green can be formed in the vertical charge transfer path at a spatial sampling frequency that is twice as high as that of the pixels of blue and red. Accordingly, the luminance signal formed has a higher frequency band than that by the conventional solid-state image pickup device. By using the luminance signal, the image pickup device can reproduce an image with excellent perceived resolution.

What is claimed is:

1. In a solid-state image pickup device comprising:
   a plurality of optoelectric transducing elements vertically and horizontally arranged into a matrix array,
   groups of said optoelectric transducing elements, arrayed in a set of first rows, serving as picture elements having a red spectral characteristic,
   groups of said optoelectric transducing elements, arrayed in a set of second rows, serving as picture elements having a blue spectral characteristic,
   whereby said second rows alternate with said first rows, and
   vertical charge transfer paths and groups of picture elements, arrayed in columns, being alternately arranged, the improvement wherein
   segmental portions of each of said vertical charge transfer paths, which portions positionally correspond to respective ones of said picture elements, include portions where charge transfer electrodes are layered and portions where no transfer electrodes are layered,
   an impurity is distributed in predetermined portions of each of said vertical charge transfer paths under said charge transfer electrodes and under said portions with no charge transfer electrodes in the charge transfer direction,
   thereby to set up potential levels of different depths, that are caused by applying a signal of a predetermined voltage to said charge transfer electrodes when an image is being sensed,
   deepest portions of said potential levels are used as picture elements of green, and
   signal charge is transferred by applying a drive signal recurring at predetermined periods to said charge transfer electrodes.

2. The solid-state image pickup device of claim 1, wherein said picture elements of green have twice the spatial density of either one of said picture elements having a blue spectral characteristic and said picture elements having a red spectral characteristic.

3. The solid-state image pickup device of claim 2, further comprising a first memory area for storing data representative of signal charges of blue and red, and a second memory area for storing data representative of signal charges of green, said first and second memory areas being of the same size.

4. The solid-state image pickup device of claim 1, further comprising a plurality of vertical overflow drains formed in a direction of substrate depth.

5. The solid-state image pickup device of claim 1, wherein said set of first rows constitutes odd-numbered rows in said matrix array, and said set of second rows constitutes even-numbered rows in said matrix array.

6. The solid-state image pickup device of claim 1, wherein said set of first rows constitutes even-numbered rows in said matrix array, and said set of second rows constitutes odd-numbered rows in said matrix array.

* * * * *